(12) United States Patent
Lo et al.

(10) Patent No.: US 9,607,809 B2
(45) Date of Patent: Mar. 28, 2017

(54) HIGH DENSITY PLASMA REACTOR WITH MULTIPLE TOP COILS

(71) Applicant: Taiwan Semiconductor Manufacturing Co., Ltd., Hsin-Chu (TW)

(72) Inventors: Chi-Ching Lo, Hsinchu (TW); Po-Hsiung Leu, Lujhu Township (TW); Tzu-Chun Lin, Zhudong Township (TW); Ding-I Liu, Hsinchu (TW); Jen-Chi Chang, Hsinchu (TW); Ho-Ta Chuang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/207,468

(22) Filed: Mar. 12, 2014

(65) Prior Publication Data

US 2014/0273537 A1 Sep. 18, 2014

Related U.S. Application Data

(60) Provisional application No. 61/777,686, filed on Mar. 13, 2013.

(51) Int. Cl.
*C23C 16/00* (2006.01)
*H01J 37/32* (2006.01)
*C23C 16/507* (2006.01)

(52) U.S. Cl.
CPC .......... *H01J 37/321* (2013.01); *C23C 16/507* (2013.01); *H01J 37/3211* (2013.01)

(58) Field of Classification Search
CPC .... H01J 37/321; H01J 37/3211; C23C 16/507
See application file for complete search history.

(56) References Cited

U.S. PATENT DOCUMENTS

| | | | |
|---|---|---|---|
| 5,401,350 A * | 3/1995 | Patrick | H05H 1/46 118/723 I |
| 6,238,588 B1 * | 5/2001 | Collins et al. | 216/68 |
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,912,581 B2 | 12/2014 | Lin et al. | |
| 8,941,212 B2 | 1/2015 | Yen et al. | |
| 9,184,256 B2 | 11/2015 | Huang et al. | |
| 9,209,521 B2 | 12/2015 | Hung et al. | |
| 2014/0132333 A1 | 5/2014 | Jin et al. | |
| 2014/0253262 A1 | 9/2014 | Hsieh et al. | |
| 2014/0253391 A1 | 9/2014 | Yen | |
| 2015/0364417 A1 | 12/2015 | Lee | |

* cited by examiner

*Primary Examiner* — Richard Booth
(74) *Attorney, Agent, or Firm* — Duane Morris LLP

(57) ABSTRACT

A plasma reactor includes an enclosure having a top and a bottom and defining a processing chamber. Inlets are formed in the enclosure for injecting process gas into the chamber. An outlet is formed in the enclosure for withdrawing gas from the chamber. A platform is positioned to support a wafer in the chamber above the bottom. A plurality of coils is positioned above the top of the chamber. Each coil is coupled to a radio frequency generator.

16 Claims, 4 Drawing Sheets

HIGH DENSITY PLASMA REACTOR WITH MULTIPLE TOP COILS

CROSS-REFERENCE TO RELATED APPLICATION

This application claims priority from U.S. Provisional Application No. 61/777,686 filed Mar. 13, 2013 which is expressly incorporated by reference herein in its entirety.

BACKGROUND

This disclosure relates generally to high density plasma reactors, and more particularly to high density plasma reactors with multiple top coils.

Plasma reactors are commonly used in semiconductor processing. For example, in high density plasma chemical vapor deposition (HDPCVD) processing, a plasma of process gases is generated in the reactor to deposit a film of material on a silicon wafer. It is important in semiconductor processing that the thickness profile of the film formed on the wafer be as uniform as possible.

A plasma reactor includes a chamber that contains the plasma, gases and the wafer, which is supported on a platform such as an electrostatic chuck. The chamber is typically formed of a metal, such as aluminum. The inside of the chamber may be covered with an insulating layer. The top or ceiling of the chamber is formed from a dielectric material. The reactor includes a planar top coil that is positioned above the ceiling. The coil is coupled to a radio frequency (RF) generator. The coil transmits RF energy into the chamber to excite and power the plasma created from the gases in the chamber.

Techniques have been developed to design and tune plasma reactors to produce acceptably uniform film thickness profiles on wafers up to about 300 millimeters in diameter. However, there is a trend toward ever increasing wafer diameters. Existing reactor designs are unable to achieve acceptable film thickness uniformity for wafers as large as 450 millimeters in diameter.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 1:
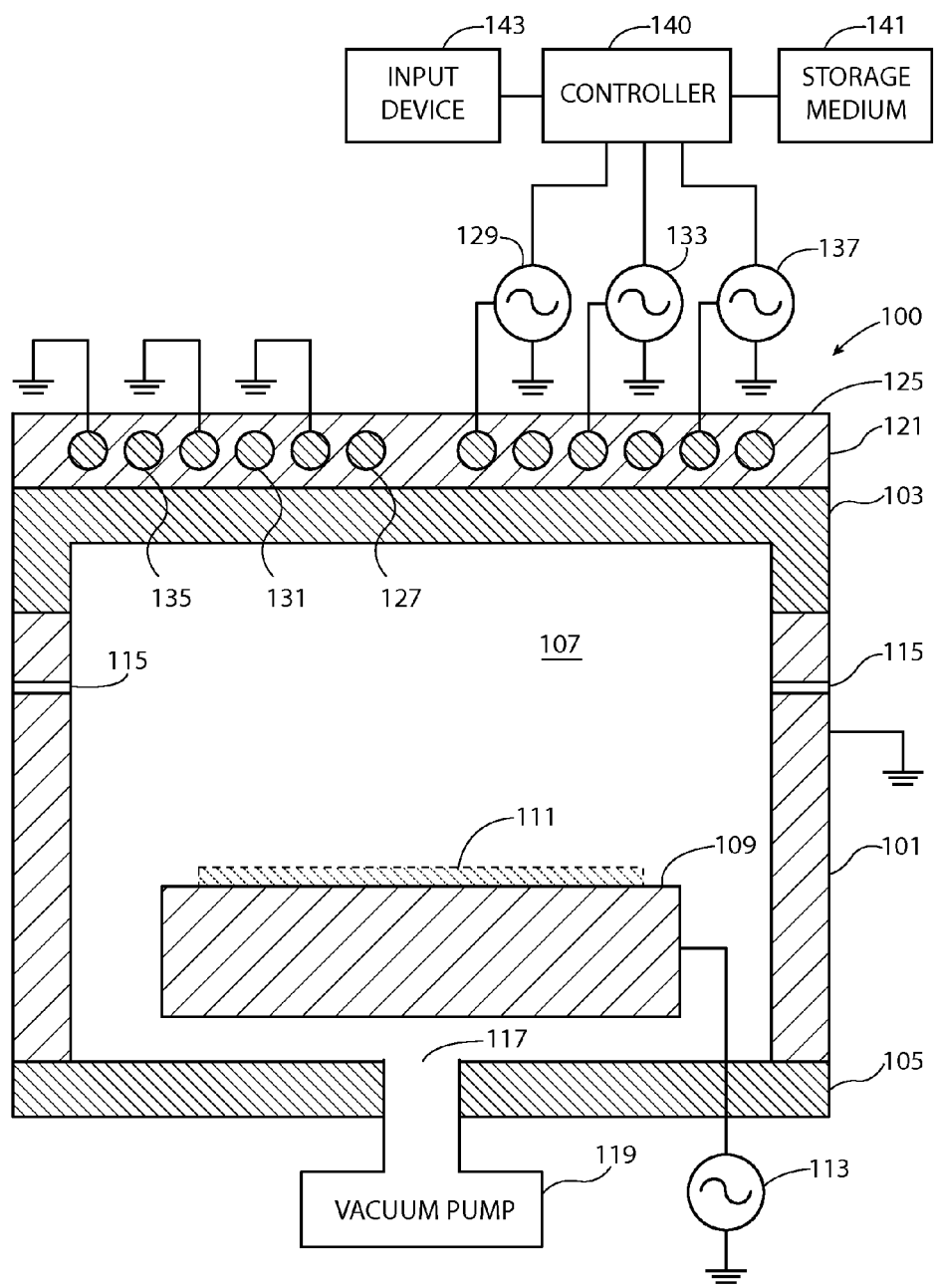
FIG. 1 is a side section view of an embodiment of a reactor.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning coupling and the like, such as "connected" and "interconnected," refer to a relationship wherein devices or nodes are in direct or indirect electrical communication, unless expressly described otherwise.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 4:
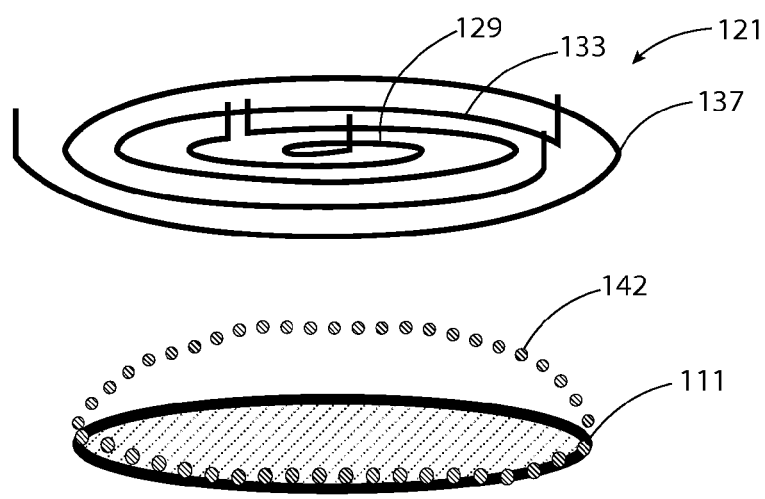
FIG. 4 is a schematic diagram of the reactor of FIG. 1 in use.

Referring now the drawings, and first to FIGS. 1 and 4, an embodiment of a high density plasma reactor is designated generally by the numeral 100. Reactor 100 includes an enclosure formed by a cylindrical side wall 101, a bowl-shaped top or ceiling 103, and a disk-shaped base 105, to form a chamber 107. Side wall 101 and base 105 are formed from a metal, such as aluminum, lined with an insulating material such as quartz or alumina. Ceiling 103 is formed from a dielectric material such as quartz, alumina, silicon nitride, or aluminum nitride.

Base 105 supports a pedestal 109, which in turn supports a semiconductor wafer 111 to be processed in chamber 107. Pedestal 109 may comprise an electrostatic chuck. A radio frequency (RF) generator 113 applies an RF bias to pedestal 109.

Side wall 101 has formed therein a plurality of inlets 115 for injecting process gases into chamber 107. Inlets 115 are connected to a gas source or sources through a suitable manifold system, neither shown. Base 105 has formed therein an outlet 117, which is connected to a vacuum pump 119. Vacuum pump 119 evacuates chamber 107 to an appropriate pressure.

Ceiling 103 has mounted thereto a top coil assembly 121. In the embodiment of FIGS. 1 and 4, top coil assembly 121 includes three concentric, coplanar, spiral coils encapsulated in an insulator 125. The plane defined by top coil assembly 121 is parallel to the plane of wafer 111.

Top coil assembly 121 includes an inner coil 127, an intermediate coil 131, and an outer coil 135. Inner coil 127 is coupled to a first RF generator 129; intermediate coil 131 is coupled to a second RF generator 133; and, outer coil 135 is coupled to a third RF generator 137. RF generators 129, 133, and 137 are independently controlled to supply power selectively to their associated coils 127, 131, and 135, respectively. For example, first RF generator 129 may apply 1950 watts of RF power to inner coil 127; second RF generator 133 may apply 2100 watts of RF power to intermediate coil 131; and, third RF generator 137 may apply 2000 watts of RF power to outer coil 135. By independently controlling the power applied to each coil 127, 131, and 135, top coil assembly 121 may be tuned to deposit a layer of material on wafer 111 having a substantially uniform thickness profile. RF generators 129, 133, and 137 may all be tuned to the same frequency—for example, 2 megahertz.

In some embodiments, a controller 140 controls each of the RF generators 129, 133, 137 independently, to provide a more uniform plasma level in each of the zones of the chamber. The controller can be a microcontroller, an embedded microprocessor, or a computing device, such as a computer, laptop, tablet or the like. The controller 140 is programmed with computer program code to receive or compute the RF power level for each generator 129, 133, 137, translate the power levels into appropriate analog or digital signals to control the RF generators 129, 133, 137, and transmit the control signals to the RF generators. The computer program code is accessed in a non-transitory, machine readable storage medium 141 (e.g., flash, dynamic random access memory, hard disk, optical disk, magnetic disk, or the like) connected to the controller.

In some embodiments, the controller 140 is a computer with a display. The computer displays an input screen prompting a user to input the respective power levels for each of the RF generators 129, 133 and 137. The user (e.g., an engineer) can determine the power levels based on empirical data concerning the uniformity of film thicknesses produced on a wafer within the chamber 107 with each RF generator set at a variety of power levels. The user inputs can be entered using any input device 143, such as a keyboard, touch screen, pointing device, or the like.

Figure 2:
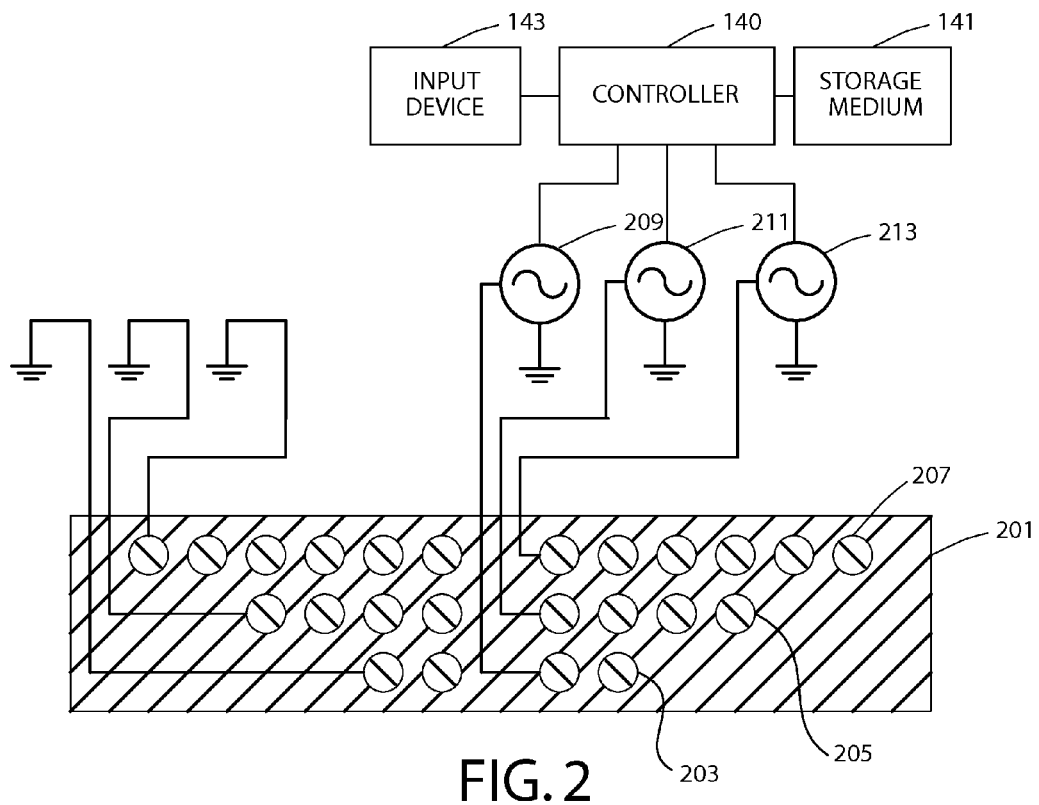
FIG. 2 is a side section view of an alternative embodiment of a top coil.
Figure 5:
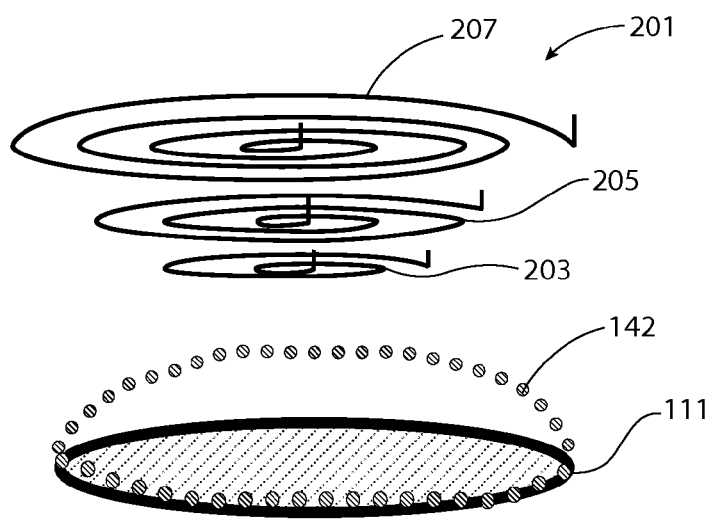
FIG. 5 is a schematic diagram of the reactor of FIG. 2 in use.

An alternate top coil assembly 201 is illustrated in FIGS. 2 and 5. Top coil assembly 201 includes an inner coil 203, an intermediate coil 205, and an outer coil 207. Each coil 202, 205, and 207 is spiral and concentric. However, coils 203, 205, and 207 reside in different parallel planes. Coils 203, 205, and 207 are coupled to independently controlled RF generators 209, 211, and 213, respectively, which supply difference levels of RF power to their associated coils under control of controller 140.

Figure 3:
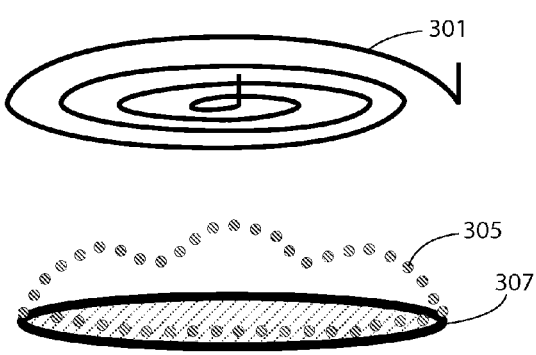
FIG. 3 is a schematic diagram of the reactor of the prior art in use.

FIGS. 3-5 illustrate the improvement in film thickness uniformity achieved by embodiments according to the present disclosure, in contrast to that of the prior art. It will be recognized that FIGS. 3-5 are not to scale. In FIG. 3, a single coil 301 is used to apply a layer 305 of material to the surface of a wafer 307. The magnetic field produced by single coil 301 is non-uniform over the surface of wafer 307. The non-uniform magnetic field produces non-uniformities in the density of the plasma over the surface of wafer 307. The speed of deposition of material on the surface of wafer 307 is related to the density of the plasma. Accordingly, single coil 307 produces a characteristic wavy, non-uniform material layer 305 cross-section profile, with a high spot in the middle, an annular valley around the high spot in the middle, and an annular ridge between the valley and the edge of wafer 307, as shown in FIG. 3.

In contrast, as shown in FIGS. 4 and 5, separately tuned, three-coil arrangements 121 and 301, respectively, produce a more uniform layer 142 of material on the surface of wafer 111. Although layer 142 is thicker in the middle of wafer 111 than it is at the edges, it is substantially more uniform than layer 305 and it does not have the characteristic profile of layer 305. In experiments, the range of thickness, from thinnest to thickest, of the layer of material over the surface of the wafer made according to embodiments of the present disclosure is about half that made according to the prior art.

Although in the illustrated embodiments, the top coil assembly comprises three coils, other embodiments may include only two coils or more than three coils.

Figure 6:
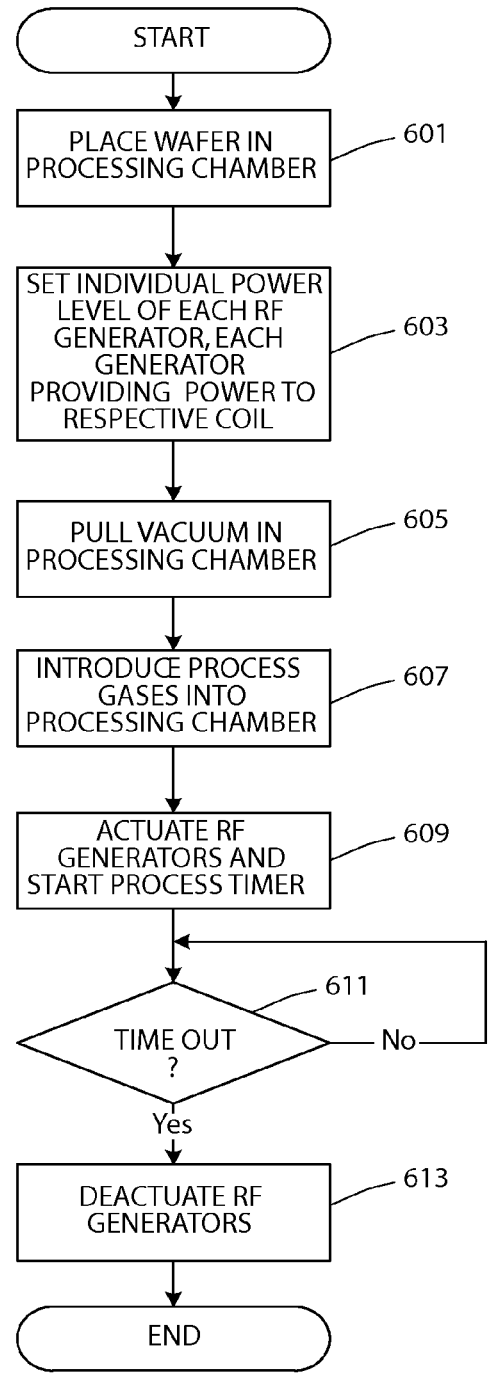
FIG. 6 is a flow chart of a method of using the reactor of FIG. 1.

FIG. 6 is a flow chart of an example of a method for using the system described herein.

At step 601, a wafer is placed in a processing chamber having an enclosure having a side wall, a top and a bottom to define a processing chamber. The chamber has a plurality of inlets in the enclosure for injecting process gas into the chamber. An outlet is provided in the enclosure for withdrawing gas from the chamber. A platform is provided for supporting a wafer in the chamber above the bottom. A plurality of coils are positioned above at the top of the chamber. Each respective coil is coupled to a respective radio frequency generator.

At step 603, the power level of each of the plurality of RF generators is set, for providing respective independently controlled power levels to each respective one of the coils.

At step 605, a vacuum is pulled in the processing chamber. Then, process gasses are introduced into the processing chamber, at step 607.

At step 609, the RF generators are actuated and a process timer is started. When, as determined at decision block 611, the process timer times out, the RF generators are deactuated, as indicated at step 613, and the process ends.

In some embodiments, a plasma reactor comprises: an enclosure having a side wall, a top and a bottom to define a processing chamber; a plurality of inlets in the enclosure for injecting process gas into the chamber; an outlet in the enclosure for withdrawing gas from the chamber; a platform for supporting a wafer in the chamber above the bottom; and a plurality of coils positioned above at the top of the chamber, wherein each respective coil is coupled to a respective radio frequency generator.

In some embodiments, the coils are concentric.

In some embodiments, the coils are coplanar.

In some embodiments, each coil defines a plane and the planes are parallel to each other.

In some embodiments, the platform is configured to support the wafer defines with a top surface of the wafer located in a plane and the planes defined by the coils are parallel to the plane defined by of the top surface of the wafer.

In some embodiments, each radio frequency generator is configured to provides independently controlled power to the coil to which it is coupled.

In some embodiments, the radio frequency generators are configured to provide a different power level is provided to each respective coil.

Some embodiments, further comprise a controller for controlling the respective power level of each respective coil.

In some embodiments, a plasma reactor has a chamber and apparatus comprising: a pedestal adapted to support a semiconductor wafer; a plurality of coils positioned at an end of the chamber opposite the pedestal; a plurality of radio frequency generators, wherein each respective coil is coupled to a respective radio frequency generator.

In some embodiments, the coils are concentric and coplanar.

In some embodiments, each radio frequency generator is configured to provide independently controlled power to the coil to which it is coupled.

In some embodiments, the radio frequency generators are configured to provide a different power level is provided to each respective coil.

Some embodiments further comprise a controller for controlling the respective power level of each respective coil.

Some embodiments further comprise a non-transitory machine readable storage medium containing computer program instructions that are executable by the controller to set individual RF power levels for each respective one of the controllers.

In some embodiments, a method comprises: placing a semiconductor wafer in a processing chamber having a plurality of radio frequency coils; setting individual power levels of each of a plurality of radio frequency generators, each radio frequency generator coupled to a respective one of the plurality of radio frequency coils; and generating a plasma in the processing chamber using the plurality of radio frequency coils for depositing a film on the semiconductor wafer.

In some embodiments, the coils are concentric.

In some embodiments, the coils are coplanar.

In some embodiments, each coil defines a plane and the planes are parallel to each other.

In some embodiments, the wafer is placed in the processing chamber with a top surface of the wafer located in a plane and the planes defined by the coils are parallel to the plane of the top surface of the wafer.

In some embodiments, a method includes introducing process gas into the processing chamber.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The above-described embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

While preferred embodiments of the present subject matter have been described, it is to be understood that the embodiments described are illustrative only and that the appended claims shall be accorded a full range of equivalents, many variations and modifications naturally occurring to those of skill in the art from a perusal hereof.

What is claimed is:

1. A plasma reactor, which comprises:
   an enclosure having a side wall, a top and a bottom to define a processing chamber;
   a plurality of inlets in the enclosure for injecting process gas into the chamber;
   an outlet in the enclosure for withdrawing gas from the chamber;
   a platform for supporting a wafer in the chamber above the bottom; and
   a plurality of planar spiral coils positioned at the top of the chamber, including a first planar spiral coil at a first height and a second planar spiral coil at a second height above the first height, wherein each respective one of the plurality of planar spiral coils is coupled to a respective radio frequency generator, wherein each radio frequency generator is configured to provide independently controlled power to the planar spiral coil to which it is coupled, wherein:
   each of the first and second planar spiral coils includes plural windings,
   each of the first and second planar spiral coils has a same inner radius, and
   the second planar spiral coil has more windings and a greater outer radius than the first planar spiral coil.

2. The plasma reactor as claimed in claim 1, wherein the windings within each individual planar spiral coil are coplanar.

3. The plasma reactor as claimed in claim 1, wherein each planar spiral coil lies in a respective plane and the planes are parallel to each other.

4. The plasma reactor as claimed in claim 1, wherein the radio frequency generators are configured to provide a different power level to each respective planar spiral coil.

5. The plasma reactor of claim 4, further comprising a controller for controlling the respective power level of each respective planar spiral coil.

6. In a plasma reactor having a chamber, apparatus comprising:
   a pedestal adapted to support a semiconductor wafer;
   a plurality of planar spiral coils encapsulated in a single insulator positioned at an end of the chamber opposite the pedestal, including a first planar spiral coil at a first height and a second planar spiral coil at a second height above the first height, wherein each of the first and second planar spiral coils has a same inner radius, and the second planar spiral coil has a greater number of windings and a greater outer radius than the first planar spiral coil;
   a plurality of radio frequency generators, wherein each respective one of the plurality of planar spiral coils is coupled to a respective radio frequency generator, wherein each radio frequency generator is configured to provide independently controlled power to the planar spiral coil to which it is coupled.

7. The apparatus of claim 6, wherein the radio frequency generators are configured to provide a different power level to each respective planar spiral coil.

8. The apparatus of claim 7, further comprising a controller for controlling the respective power level of each respective planar spiral coil.

9. The apparatus of claim 8, further comprising a non-transitory machine readable storage medium containing computer program instructions that are executable by the controller to set individual RF power levels for each respective one of the controllers, and to tune the radio frequency generators to deposit a layer of material having a substantially uniform thickness profile on the wafer.

10. The plasma reactor of claim 1, wherein
the plurality of planar coils includes a third planar spiral coil coupled to a third RF generator, the third planar spiral coil located at a third height above the second height, and
wherein the third planar spiral coil has more windings than the second planar spiral coil,
the third planar spiral coil has an outer radius greater than the outer radius of the second planar spiral coil,
such that the windings of the first planar spiral coil are aligned below innermost ones of the windings of the second planar spiral coil, and the windings of the second planar spiral coil are aligned below innermost ones of the windings of the third planar spiral coil.

11. The plasma reactor of claim 10, further comprising a non-transitory machine readable storage medium containing computer program instructions that are executable by the controller to set individual RF power levels for each respective one of the controllers, and to tune the radio frequency generators to deposit a layer of material having a substantially uniform thickness profile on the wafer.

12. The plasma reactor of claim 10, wherein the plurality of planar spiral coils are all encapsulated in a single insulator.

13. The plasma reactor as claimed in claim 1, wherein the inner radius is near a center of each planar spiral coil.

14. The apparatus of claim 6, wherein the inner radius is near a center of each planar spiral coil.

15. The apparatus of claim 6, wherein
the plurality of planar spiral coils includes a third planar spiral coil encapsulated in the insulator and coupled to a third radio frequency generator, the third planar spiral coil located at a third height above the second height,
wherein the third planar spiral coil has more windings than the second planar spiral coil, and
the third planar coil has an outer radius greater than the outer radius of the second planar spiral coil, such that the windings of the first planar spiral coil are aligned below innermost ones of the windings of the second planar spiral coil, and the windings of the second planar spiral coil are aligned below innermost ones of the windings of the third planar spiral coil.

16. The plasma reactor of claim 1, wherein the plurality of planar spiral coils are encapsulated in a single insulator.

* * * * *